United States Patent [19]
Sitter

[11] 3,932,838
[45] Jan. 13, 1976

[54] METHOD AND APPARATUS FOR CONTROLLING CIRCUITRY WITH A PLURALITY OF SWITCHING MEANS

[75] Inventor: David N. Sitter, Waynesboro, Va.

[73] Assignee: General Electric Company, Waynesboro, Va.

[22] Filed: Dec. 5, 1973

[21] Appl. No.: 421,981

Related U.S. Application Data

[63] Continuation of Ser. No. 136,853, April 23, 1971, abandoned.

[52] U.S. Cl.... 340/146.1 AB; 340/172.5; 340/365 E
[51] Int. Cl.² .................... G06F 3/02; B41J 5/22
[58] Field of Search .......... 340/172.5, 146.1, 365 E; 178/17; 200/5; 197/17, 19; 235/145

[56] References Cited
UNITED STATES PATENTS

| | | | |
|---|---|---|---|
| 3,292,764 | 12/1966 | Midgette et al. | 199/18 |
| 3,308,429 | 3/1967 | MacWilliams | 340/146.1 AL |
| 3,308,918 | 3/1967 | James | 178/17 C X |
| 3,470,539 | 9/1969 | Proud, Jr. et al. | 340/172.5 |
| 3,623,016 | 11/1971 | Winkler | 340/146.1 R |
| 3,750,160 | 7/1973 | Elzinga | 340/146.1 AB |
| 3,753,007 | 8/1973 | Viswanathan | 340/365 E |

OTHER PUBLICATIONS

IBM Tech. Disclosure Bulletin, *Keyboard Circuit* by L. G. Lankford, Vol. 9, No. 6, Nov. 1966, pp. 586–587.
IBM Tech. Disclosure Bulletin "Keyboard Scanning" by Beavsoleil et al. Vol. 9, No. 5, Oct. 1966 pp. 532–533.
IBM Tech. Disclosure Bulletin "Typewriter with Electronic Separation of Input" by Becker, Vol. 8, No. 11, Apr. 1966 pp. 1502–1504.

*Primary Examiner*—Gareth D. Shaw
*Assistant Examiner*—Paul R. Woods

[57] ABSTRACT

The potential errors introduced by contact bounce are eliminated by a system which accepts applied key data. The system will accept key data provided first, that it is a proper logic code; second, that the system is in a state to accept new data; and, finally, that it is either different than the previous acceptable logic code or that it is preceded by a no key period measurably exceeding the contact bounce time and shorter than the normal human response time of the typist.

27 Claims, 8 Drawing Figures

FIG. I

*INVENTOR.*
DAVID N. SITTER
BY Michael Masnick

HIS ATTORNEY

INVENTOR.
DAVID N. SITTER
BY Michael Masnik
HIS ATTORNEY

INVENTOR.
DAVID N. SITTER

METHOD AND APPARATUS FOR CONTROLLING CIRCUITRY WITH A PLURALITY OF SWITCHING MEANS

This is a continuation, of application Ser. No. 136,853, filed Apr. 23, 1971 now abandoned.

BACKGROUND OF THE INVENTION

1. Field of the Invention

This invention relates to the operation of circuitry in response to electrical signals developed by the selection of keys or switches; and particularly to resolving errors in operation resulting from improper key selection as, for example, by the operator of a keyboard printer.

2. Description of the Prior Art

Oftentimes, electronic keyboards generate an undesirable bounce or transient in the electrical signal output due to limitations in key design or improper selection or operation of the keys by an operator. The bounce appears as transient impulses which occur within the key generated electrical signals. A problem arises due to the fact that the electronic implementing circuitry associated with key operation or switching is frequently able to function at much greater speeds than either the operator or the mechanical apparatus. Consequently, when a signal bounce occurs due to improper key operation, the succeeding electronic equipment may respond to both the desirable switching action and the undesirable transient effects. To avoid this erroneous interpretation, it has previously been necessary to resort to expensive and complicated methods for eliminating the bounce in the key originated signals or to unduly limit the speed of response of such successive electronic equipment to such signals.

One of the areas in which this problem oftentimes arises involves keyboard control systems for printers, tape punches, typewriters, etc. In such systems, an operator selects or operates one of a plurality of possible switches or keys by depressing keys on a keyboard. The rate at which successive keys are depressed depends upon the reaction time of both the operator and the apparatus. Tests indicate that the repetitive actuation of the same key with the same finger on standard electric typewriters, for example, involves about 80 milliseconds. On the other hand, an operator may select successively different keys using different fingers within a releatively shorter interval of time, such as 5 or so milliseconds.

To date, potential ambiguity introduced by signal bounce and other short term imperfect switching operations has been eliminated by blanking the signal responsive circuitry for a predetermined time interval following key operation - for example, an interval of the order of 30 or so milliseconds. Thus, any additional transients are assumed to occur before the sensing circuitry is again permitted to function. As explained hereinafter, this technique limits the rapid selection of keys by certain operators. Furthermore, it does not avoid certain problems, such as ambiguity, which arise in the event of flutter upon release of a key or other similar problems.

SUMMARY OF THE INVENTION

The present invention takes into consideration the fact that an operator has a predictable reaction time which will permit that operator to carry out identical operations within some minimum period of time. With this knowledge, circuitry has been designed to detect erroneous operations by the operator and/or contact bounce, and effect a delay in the event that such erroneous operations arise. On the other hand, non-duplicate successive switch operations may occur at any time and any frequency depending on the operator's speed and the maximum design speed of the machine, and these nonduplicate selections will be processed at the maximum speed within the capabilities of the succeeding electronic circuitry.

An object of the present invention is to provide an improved multiple switch control system.

Another object of the present invention is to provide an improved multiple switch control system wherein the erroneous effects of contact bounce are eliminated.

Another object of the present invention is to provide an improved keyboard control system wherein successive keys may be selected and responded to without interposition of a delay before processing.

A further object is to resolve ambiguities or problems associated with improper operation of keys in an electronic keyboard by resorting to improved logic circuitry.

In accordance with one aspect of the invention there is provided a method of controlling circuitry in response to operation of individual ones of a plurality of switching means, comprising storing a signal uniquely identifying each of the switching means in a first storage unit upon operation thereof; transferring the stored signal to a second storage unit only when it correctly represents any one of the switching means and it is not identical to a signal previously stored in the second storage unit; controlling circuitry in response to said signal previously stored in the second storage unit; and thereafter controlling circuitry in response to the transferred signal stored in the second storage unit.

In accordance with another aspect of the invention there is provided apparatus for controlling circuitry in response to operation of individual ones of a plurality of switching means, comprising means for generating discrete signals in response to operation of each of the switching means, first means for storing these discrete signals when generated, second means for storing these discrete signals, means for transferring a signal stored in the first means into the second means only when it correctly represents operation of any one of the switching means and it is not identical to the signal previously stored in the second means, and means for controlling said circuitry in accordance with the transferred signal stored in the second means only after said circuitry has responded to said signal previously stored in the second storage unit.

The aforecited general objects and the various unique features of the present invention will be more clearly appreciated from the following description of a particular illustrative embodiment which is made in conjuction with the accompanying drawings.

DESCRIPTION OF THE PREFERRED EMBODIMENT

Before describing the operation of the present invention, attention may be given to the problems encountered with keyboard control systems which accept the operation of the switch or key, and then ignores any change in the associated signal output, such as that due to signal transients associated with key operation, for a fixed period of time. After said fixed period of time new signals will be accepted provided that the signals are initiated after the period of time. Because of the nature of the signals developed, this latter condition is recognized because these new signals are preceded by an invalid character condition which is either a no key operation or a multiple key operation. The fixed delay must be long enough to accommodate the worst bounce conditions anticipated. It will be understood that such systems include means for converting each key selection into a signal or signals discretely representative of the particular key selected. This signal representing a keyboard character, is checked to confirm that it is valid and represents a single key operation only, and then it is used to control the succeeding utilization circuitry.

In such an arrangement, several conditions giving rise to erroneous control indications may be recognized. First, the fixed time delay may be overrun by selection of succeeding keys within less than the allowed bounce interval. Second, the bounce may occur on the closing of a second key before the first key is released and yet after elapse of the fixed delay initiated by the first key. Third, multiple closures may result from wiggle or tremble of the operator upon release of the key. Fourth, in keyboards where the data is strobed, i.e., periodically sampled at a high rate compared to the duration of the key operation, the data is presented for utilization only during the short periods of time of the strobes. It is possible for an operator to change keys during this interim period between strobes, presenting to the logic circuitry neither a no key nor a multiple key condition. This then results in the logic responding as if the new data is a continuation of the previous data. The errors introduced by these operating conditions are demonstrated by the waveforms shown in FIGS. 2 through 5.

Overrunning the Bounce Delay

Figure 2:
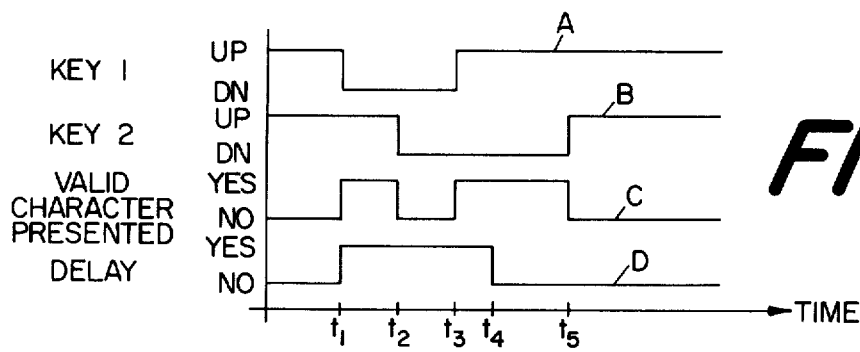
FIG. 2 comprises a plurality of waveforms showing the effect in prior systems of successive key actuations within less time than the present bounce delay.

Tests have shown that a competent typist averages approximately 80 words per minute and thereby produces the selection of about one character every 0.125 second. The stated time is an average and, of course, keys are frequently struck at a more rapid rate for certain character sets. The situation arising when two keys are struck in rapid succession is illustrated in FIG. 2. The operation of a first key at time $t_1$ is shown by waveform A. The logic circuitry reacts immediately as shown in waveform C. Simultaneously, as shown by waveform D, a fixed delay (e.g., of the order of 30 milliseconds) is initiated. Concurrent with the leading edge of waveform D, the character is accepted for processing.

At a later time $t_2$, within the delay interval, a second key is struck as shown by waveform B. With respect to the problem being considered, it is inconsequential as to whether the first key has been released at this time; but, it is required that the first key be released within the bounce eliminator delay period. When the second key is depressed, the logic circuitry detects an invalid input because of the multiple key condition. At time $t_3$, the multiple key condition is removed by the release of the first key, however, since the delay is still in effect, the new character is not recognized.

Bounce on Closing of the Second Key

Figure 3:
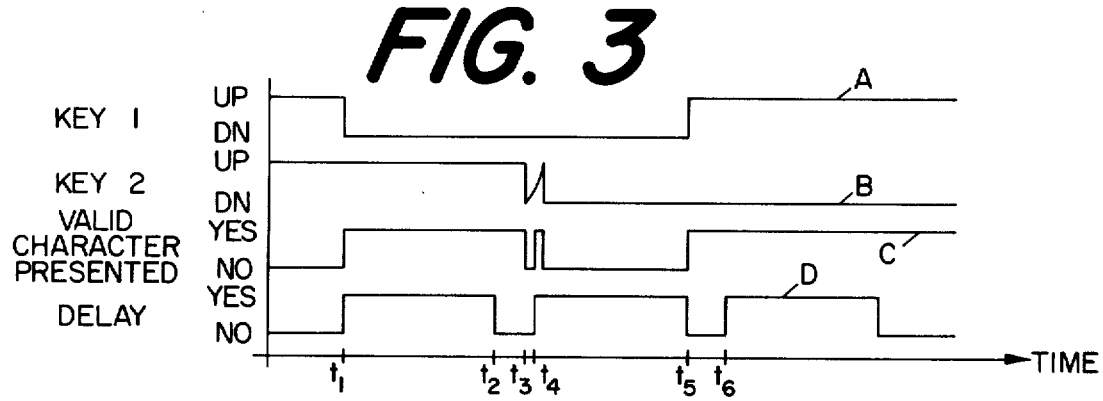
FIG. 3 comprises a plurality of waveforms showing the effect in prior systems of contact bounce upon closure of a second key before release of a first key.

FIG. 3 illustrates the effect of contact bounce upon closure of a second key. Consider the operation of fixed delay circuits when an operator selects the second key after elapse of the delay interval and before release of the first key. Under such conditions, the first key is selected at time $t_1$, as shown by waveform A. Processing of the corresponding character is begun, and the first delay is initiated. At time $t_2$ the delay is completed and new keys can be recognized; however, since the first key is still depressed, when the second key is selected at time $t_3$, a multiple key condition, representing an invalid signal condition, occurs. This conditions the system to accept a new character for processing.

Let us assume that operation of the second key has associated with it a transient signal occurring at time $t_4$ due to switch bounce. The reopening at time $t_4$ will create a one key condition and accordingly restart the delay. In addition, the circuitry will again detect the first character and process it as a new character. Thus, the first character will be improperly doubled. Subsequently, on release of the first key, the system will recognize the validity of the second key character and will process it.

The fixed delay system may also introduce an additional error if the delays initiated at time $t_4$ by the bounce of the second key mask the release of the first key. When this happens, the second key will not be recognized.

Wiggle or Tremble on Releasing Key

Figure 4:
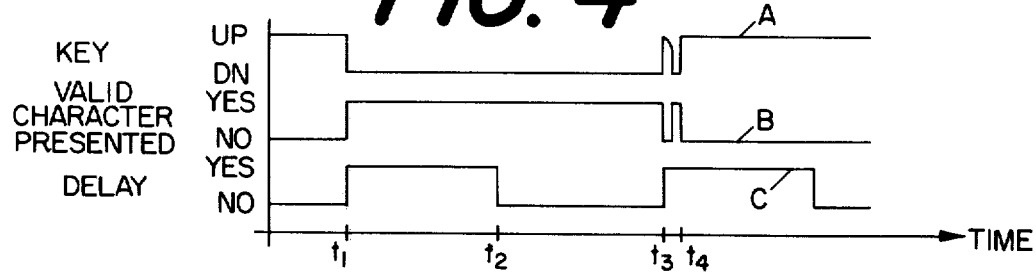
FIG. 4 comprises a plurality of waveforms showing the effect in prior systems of a wiggle or a tremble on the part of an operator during release of a key.
Figure 5:
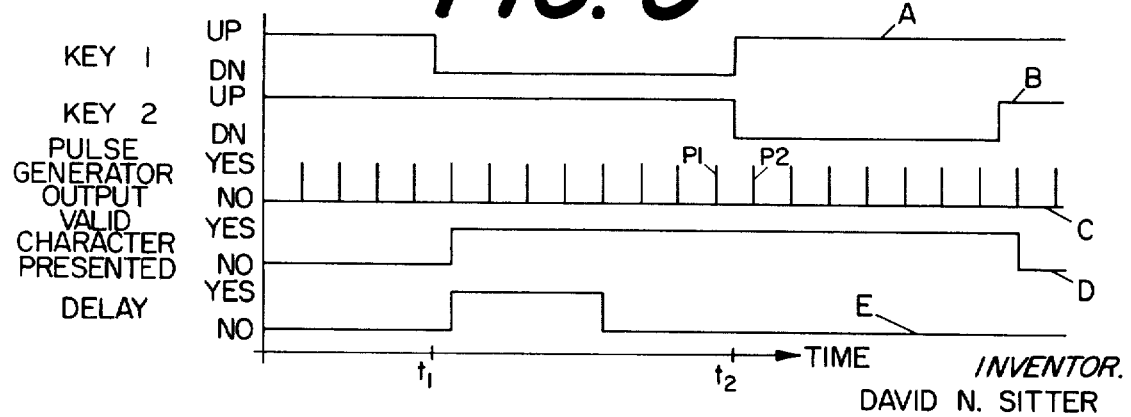
FIG. 5 comprises a plurality of waveforms showing the effect in prior systems of a change in key operation during the period between successive samplings of the key associated signals.

During the release of a key, it sometimes occurs that an operator's fingers tremble. This may be caused by many conditions, including indecision or natural body tremors. Regardless of cause, the effect of this condition is to produce a second indication that the key has been selected. Waveform A in FIG. 4 illustrates the opening and reclosure of a key upon release. The operation of the character processing circuitry responsive to such an opening and reclosure of a key is illustrated in waveform B and the functioning of the bounce eliminator delay circuitry is illustrated by waveform C. Under such conditions, the delay blanks out the effect of bounces occurring during an initial period of key operation, i.e., switch closure. After this delay, any transition which occurs, due to bounce or otherwise, is interpreted as a new character and processed by the equipment. Any tremor or wiggle on release of a key not only causes processing of the character again, but may also cause a blanking of the next character if the restarted bounce delay has not elapsed by the time the next key is selected.

Key Change During Keyboard Blind Time

In some keyboard control systems, such as the system disclosed in copending application (45-SL-01033), Ser. No. 734,501 filed June 4, 1968 by Clifford M. Jones and Earle B. McDowell and application Ser. No. 735,499 filed June 4, 1968 by Clifford M. Jones and Charles E. Atkinson, the mechanical closure of a key is converted into a corresponding discrete code by coupling a pulsed driving line to selected ones of a plurality of code lines. These code lines control the utilization circuitry. The driving line is pulsed at some fixed repetition rate by a pulse generator and consequently the detection rate of a key closure is limited to this repetition rate. If an operator strikes one key at time $t_1$ and changes to another key at time $t_2$ within the period between the pulses P1 and P2 at this repetition rate, the system will respond only to the first key and ignore the second key operation. It is desirable to respond to both key operations.

The present invention constitutes an improvement in the solution of the problems enumerated above. As previously noted, when an operator deliberately types a double character, for example, ee, mm, tt, the physical action of lifting the finger and restriking the key quite consistently requires a time running in the neighborhood of 80 milliseconds. Knowing this, any no key condition that exists for a period in the order of 30 milliseconds may be considered a request to process the next character, whether or not it is the same as the one just processed. With this theory of operation, a method and means has been developed wherein the equipment accepts and processes any discrete character different from its predecessor, with no special time delay provided to accommodate contact bounce or signal transients. The invention provides that a no key condition must exist for a period longer than the maximum time attributed to a key bounce or signal transients associated therewith and a period shorter than the normal time for an operator to actuate the same key with the same finger, as previously described. In a preferred embodiment, this period was selected to be of the order of 30 milliseconds. In such a case, even a duplicate succeeding character will be processed. A system for the implementation of this theory of operation is disclosed in FIG. 1.

Figure 1:
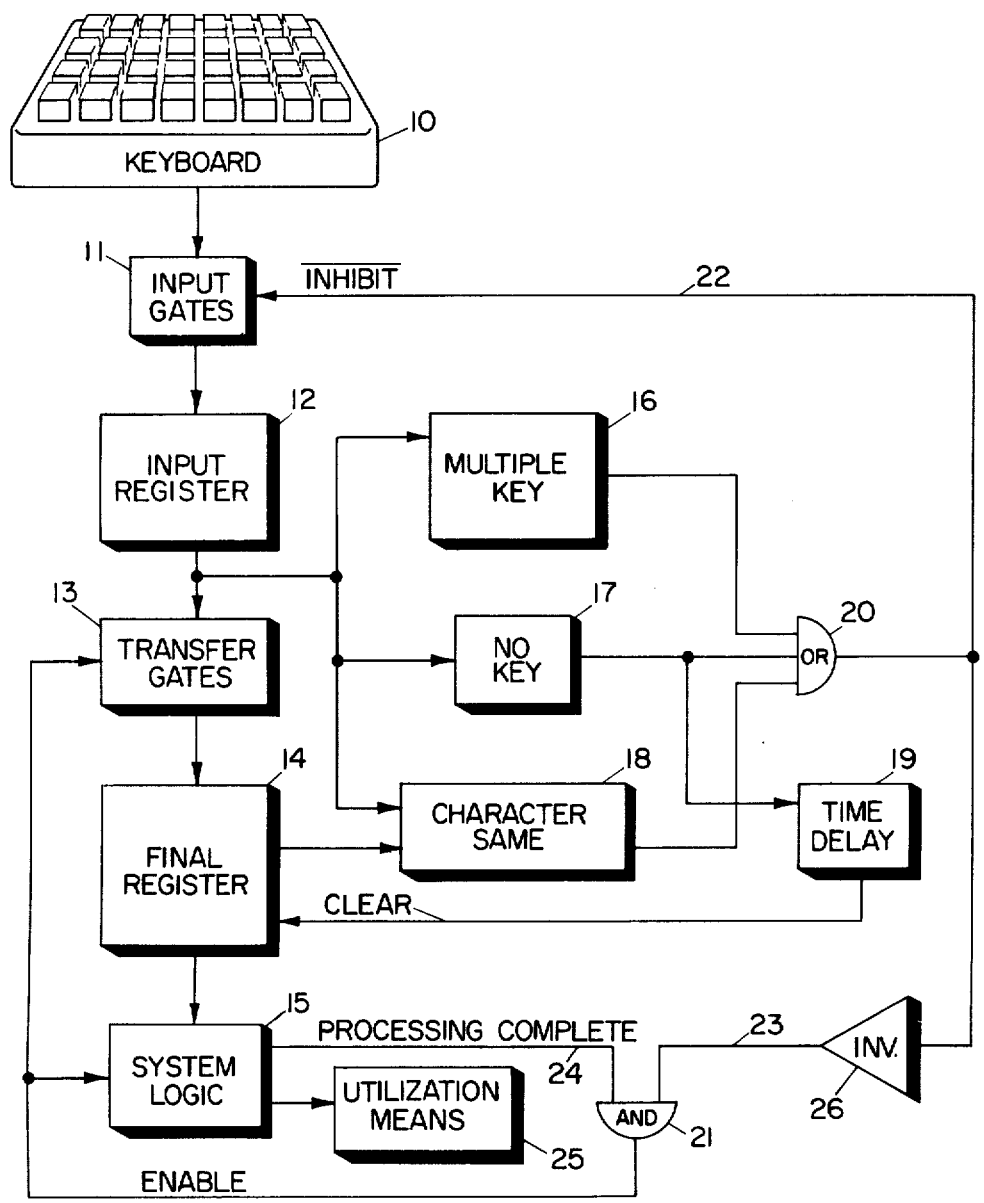
FIG. 1 is a block illustrating an embodiment of the invention in conjuction with a keyboard control system.
Figure 7:
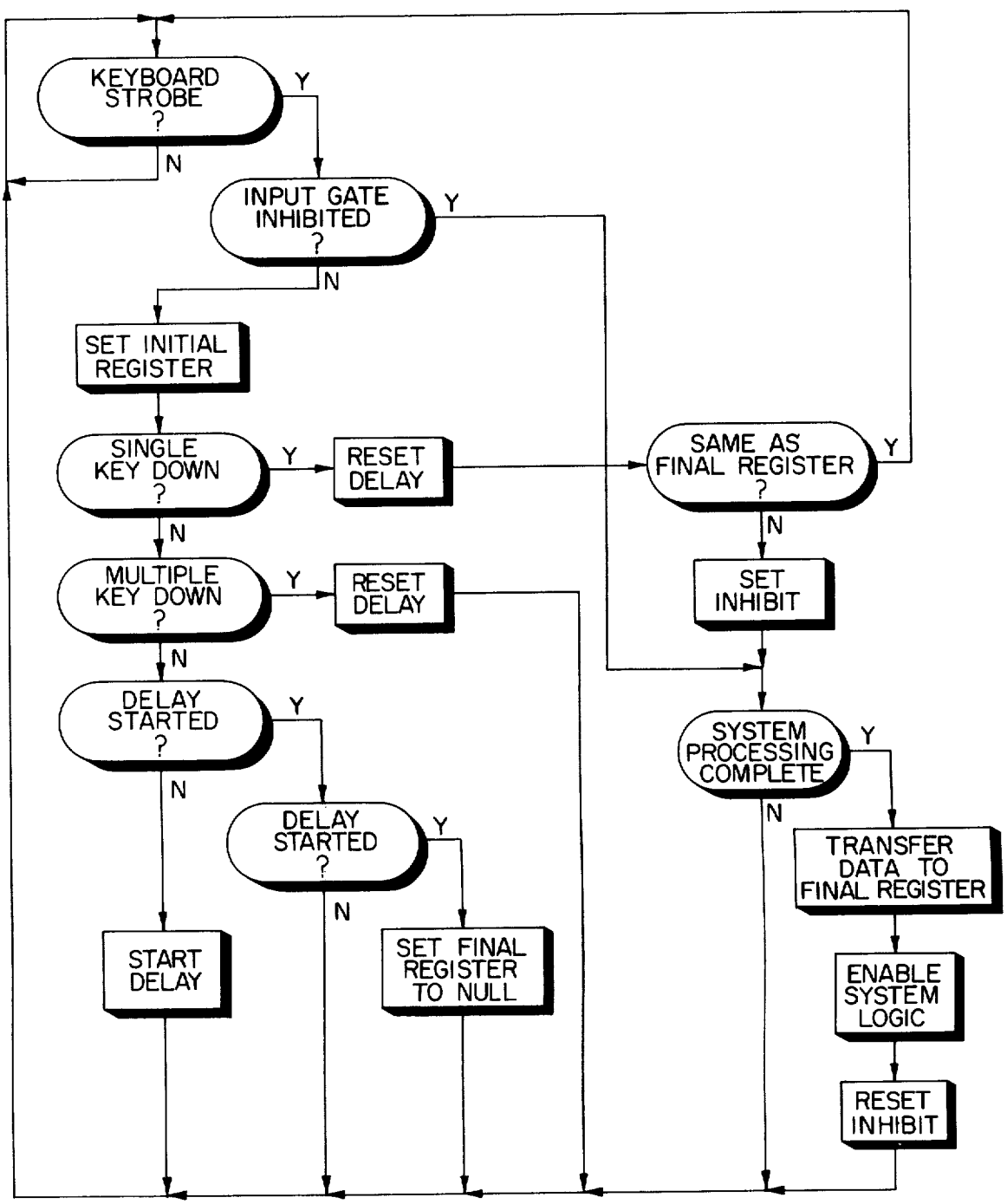
FIG. 7 is a logic flow diagram for the inventions disclosed in FIG. 1.

FIG. 1 illustrates a keyboard 10 supplying signals to input gates 11. These signals may be in the form of selective binary enablement of a plurality of code lines, producing digitally coded signals representative of the particular key selected at a recurrence rate established by a pulse generator. In a particular embodiment, each key represented a symbol and the operation of any key produced digital signals of 8 binary bits representing the particular key operation. The signals on the input gates 11 are stored in a buffer or input register 12, after being passed by normally open input gate 11, wherein they are examined or sensed in order to determine whether or not the coded information designates a valid character. If it is assumed that the equipment is functioning properly, the cause of an invalid character will be a multiple key condition, i.e., a plurality of keys operated in an overlapping time sequence, or no operated key condition. Detection circuits 16 and 17 are connected to input register 12 and evaluate the stored data to determine whether or not there is a multiple key condition or a no operated key condition, respectively. These may comprise comparator circuits as shown in FIG. 7. If either condition is detected, the data in the input register 12 is not processed because it is not a valid input. Since we are seeking valid data, OR gate 20 insures the production of an inhibit signal to the input gates on lead 22 when these invalid code conditions appear to enable the next data to be applied to input register 12 for evaluation. If the data received from 10 is found to be valid and different from that stored in register 14 by the operation of block 18, then, OR gate 20 blocks gate 11 from applying further data to the input register 12 for evaluation in order that the valid and different data may be processed. If the data in 12 has been evaluated as being valid and different from that stored in register 14, then the data on 12 is applied through gates 13 for storage in 14 in response to an Enable signal to be described, but only after the previously stored data in 14 has been utilized by utilization means 25, such as a tape recorder, printer, etc. which is defined by a Processing Complete Signal to be described. The input gate remains closed because of the operation of OR gate 20 until the data stored in 12 is transferred to register 14. This transfer is prevented by the action of the gates 13. When system logic 15 applies the data previously stored in 14 to the utilization means 25, a processing complete signal is applied over lead 24 to AND gate 21. The detailed circuitry for system block logic 15 form no part of the present invention. The function of this block is to apply the data from the final register 14 to the utilization means 25 and to produce a signal on lead 24 to indicate the signal has been transferred. In response to a logic signal on 23 indicating blocking of input gate 11 and a logic signal on 24 indicating that the previously stored data in 14 has been transferred to 25, AND gate 21 will supply an enabling signal to transfer gates 13. In response to this enabling signal from AND gate 21, transfer gates 13 apply the data stored in initial register 12 into the final register 14. At this instant, there appears on the input to the character same circuitry 18 the information stored in 12 and 14 and indicates at its output lead a logic signal indicating that the characters represented by signals stored in 12 and 14 are the same. OR gate 20 responds to the output of 18 to unblock the input gate 11 permitting the next data to be applied from keyboard 10 to the input register 12 for evaluation. In addition, the output from OR gate 20 is inverted by 26 and applied over lead 23 to AND gate 21 to produce a change in logic level to block the gates 13 and prevent transfer of the data in 12 to the final register 14.

The OR gate 20 also functions to place input gates 11 in the unblock position in response to an indication from 16 that the multiple key code has been detected in 12 or from 17 that a no operated key code has been detected from 12 or from 18 that the data stored in 12 and 14 represent the same character. Only when all three conditions do not occur is the gate 11 blocked to prevent transfer of data from keyboard 10 to register 12.

Time delay unit 19 generates a time delayed signal in response to the occurrence of a no operated key signal detected by 17. This may be due to either lack of keying activity or a bounce following key selection. At the end of the selected delay, e.g., of the order of 30 milliseconds, the final register 14 is cleared of its stored data by being set to a null or clear condition. This clear condition may be any discrete condition which differs from the valid data inputs produced by the keyboard. Thus, when final register 14 has been set to the clear condition, character comparator 18 will always indicate a lack of duplication of the data stored in 12 and 14, and permit transfer of the data from input register 12 to final register 14 provided it is a valid code. If further data is received by input register 12 before the delay established by 19 times out, device 19 is reset to its initial condition by the change in logic state at the output of 17. The further data is examined as previously described to determine whether it should be processed for utilization.

Figure 6:
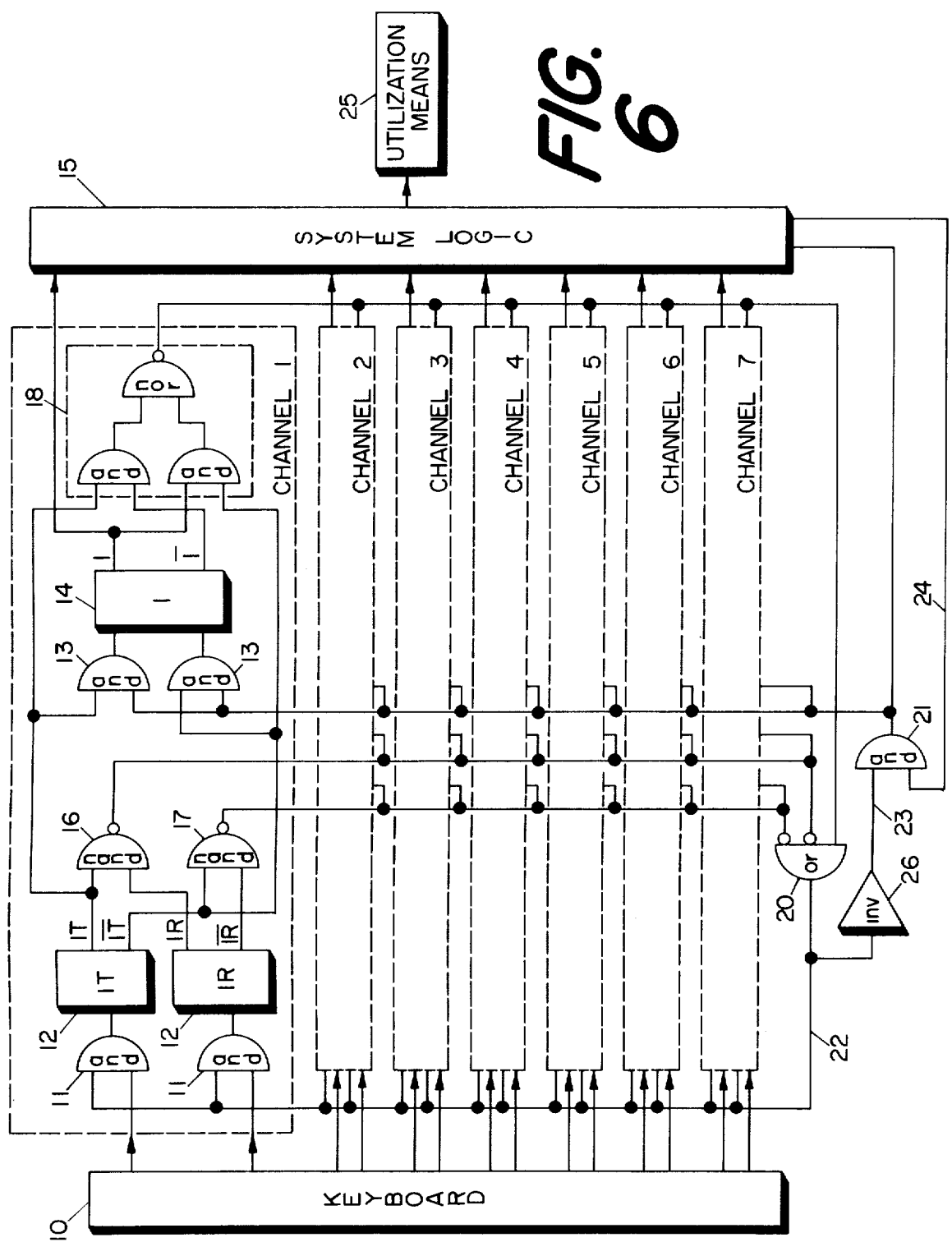
FIG. 6 is a logic diagram of certain details of the structure of FIG. 1.

Referring to FIG. 6, there are shown logic diagrams for implementing the functions defined by blocks 16, 17 and 18. Operation of the keyboard 10 produces a first and second set of digitally coded signals representing the symbol associated with the key operation.

In one particular embodiment, the code involves seven binary bits. One method of generating such a code is disclosed in a copending application filed in the names of Clifford M. Jones and Charles E. Atkinson and assigned to the General Electric Company, Ser. No. 735,499, filed June 4, 1968. Depression of any key completes a magnetic circuit for the magnetic core positioned adjacent each key. Electrical conductors thread the cores in combination to provide a digital code, with the threading pattern being unique for each key and representing a particular information code representative of a separate encoded item of information. A second set of electrical conductors thread the cores in a sense different from the threading of the first-mentioned set of electrical conductors to provide a second digital code which represents the complement of the first digital code.

The codes are so arranged that the code and the inverse code are made available over leads to the input gates 11. Because of the direct and inverse code aspects of the outputs available from keyboard 10, the input register 12 consists of 14 storage circuits represented in FIG. 6 for the bit one position as channel one. Channel one storage circuits are 1T and 1R where the T and R represent the direct or true code and the inverse or reverse code, respectively. Thus, for example, 5T and 5R represent the bit five storage circuits and the T and R would represent the direct and inverse code aspects of the same coded signals. Each storage circuit develops, in response to an input signal from its associated gate 11, a pair of signals 1T and 1T, or 1R and 1R.

Let us consider the situation where there is no multiple key nor a no operated key condition, namely that a valid code is being processed. In the case of the first channel, the inputs to the NAND gate 16 include, a 1T and a 1R signal which are complements of one another. In such a situation, the input to NAND gate 16 would be a logic 0 and a logic 1 state such that the output of NAND gate 16 would be a logic 1 establishing that no multiple key operation is present. In a similar manner, the NAND gate 17 would process the 1T and the 1R to produce a logic 1 output indicating that a single key is being operated.

On the other hand, if there is a multiple key operation, then the inputs, for example to the first channel, would both be a logic 1 causing NAND gate 16 to produce a logic 0. The 1T line and the 1R line are no longer complements since they are both in the logic 1 state, and the output of 16 being a logic zero state indicates that there is a multiple key being detected.

Similarly, under a no key condition and assuming this is indicated at the input to NAND gate 17 by signals 1T and 1R being received which are not complementary to one another, then the NAND gate 17 responds, for example, to their logic states both being logic 1 to produce an output logic state zero signaling a no key operation.

The character same function 18 is performed by applying the outputs of one of the storage circuits, for example the T circuit, from the input register 12 to separate AND gates of circuit 18 as the signals 1T and 1T together with the outputs from the final register 14 as a 1 annd 1 signal respectively. The upper AND gate responds to the 1T and the 1 signal as the lower AND gate responds to the 1 and the 1T signals. If the outputs of the register 12 and the final register 14 present the same character, then the inputs to the upper and lower AND gates would be both complementary sets resulting in a 1 state signal being generated at the output of circuit 18 indicating the characters stored in 12 and 14 are the same. On the other hand, if the characters are not the same, then both of the AND gates will be receiving two noncomplementary signals which will cause the NOR gate to produce a logic zero at the output indicating the characters are not the same.

Consider the manner in which the present invention operates under each of the potentially ambiguous conditions discussed hereinabove.

Obviously, it is not possible to select a second key within a delay interval initiated by a valid preceding non-duplicate character. As each character appears in input register 12, it is examined and OR gate 20 produces an output over lead 23 which is passed by AND gate 21 to enable the transfer gates 13 to pass the character into final register 14. In addition, it enables the system logic 15 to accept the character and pass it on to the utilization circuitry. No delay has been introduced in the described sequence of operations. The time interval between acceptance and the passing of each character is determined solely by the speed with which the system logic is able to handle individual characters.

Consider next the situation where there is a bounce upon closure of a second key. With previously existing fixed delay systems, this bounce gave rise to the possibility that the first character would be recognized and printed twice and that perhaps the second key would not be recognized.

Since there is no fixed delay automatically operative upon selection of a key in the present invention, the manner in which data is processed responsive to one key does not affect the data presented by another key. Thus, upon actuation of the first key, the corresponding character is placed into input register 12 and is duly examined and transferred into final register 14 for processing. Then, upon the initial activation of the second key, the composite signals of the first and second keys will be placed in the input register 12 and examined. The result is that a multiple key condition will be detected and there will be no action taken. As a consequence of contact bounce, the second key signal will be removed, and the first key signal will remain in the input register 12. The contents will be examined and found to be a valid code, but the same as the final register, therefore not processed. The return of the second key signal will again present a multiple key condition. However, the eventual release of the first key will leave the signals for the second key in the input register 12. These second key signals will be examined and found to be both valid and different for the code in the final register 14. Assuming the signals stored in the final register 14 have been processed, the transfer gates 13 will transfer the signals from 12 to the final register 14 and processing will begin.

Let us next consider the situation when the operator wiggles or trembles upon releasing the key. It will be recalled that this tremble, if it takes place following the initial fixed delay period of prior systems, results in duplication of the initial character. With the present invention the processing is identical to that discussed in connection with a bounce condition and no erroneous operation occurs.

When a true duplicate character condition is intended, the second character must be represented after elapse of the delay. This criteria is met automatically by the operator, since the average competent operator is not physically capable of producing duplicate characters with a spacing of much less than 80 milliseconds. If the delay is established to be in the order of 30 milliseconds, for example, when a duplicate character is selected, the time delay unit 19 will have timed out and cleared the final register of the preceding character and a favorable comparison of the two registers will result.

Thus far, we have considered the problems of successive key operation within less time than the preset bounce delay, of contact bounce upon operation of a second key before release of a first key and of wiggle or tremble on the part of an operator during release of a key. We shall now consider the effect of change in key operation, that is, operating different keys during the period between successive samplings of the signals produced by the key operation. Since the present invention requires only that the data in the initial register be valid (not a no key operation and not a multiple key operation) and different from that in the final register to be processed - the system will respond to all data regardless of how rapidly the different keys are operated in succession. Any key bounce, wiggle or tremor is resolved by the character same function 18 as previously described. The time delay unit 19 provides a time delay for resolving the operation of same key in succession but is sufficiently long in duration as to prevent timing out and clearing of the final register due to bounce, wiggle or tremor.

FIG. 7 is a logic flow diagram useful in illustrating the various logic steps involved to achieve the purposes of the present invention.

Figure 8:
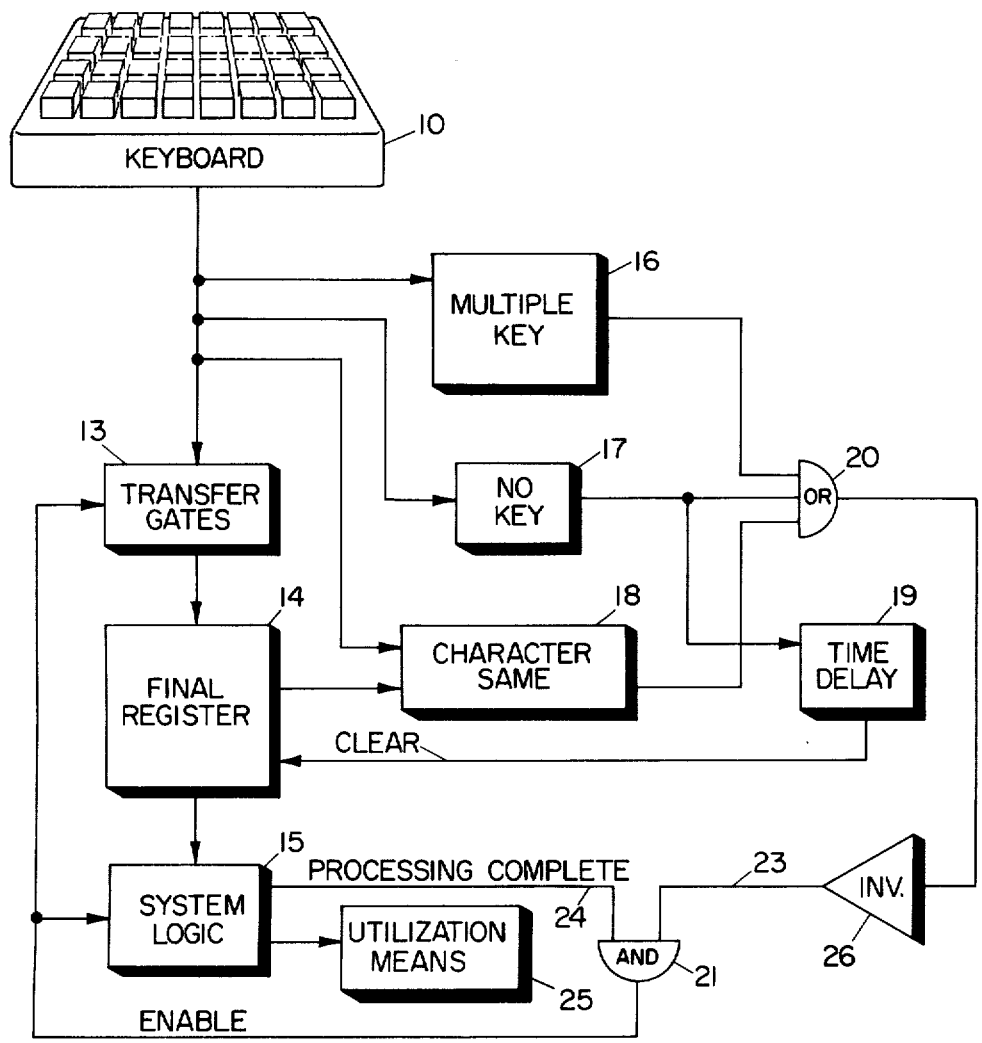
FIG. 8 illustrates a further embodiment of the invention.

FIG. 8 illustrates a further embodiment wherein the output of keyboard 10 differs from that shown in FIG. 1 in that output signals representing an operated key are continuously available as long as a key is depressed or being operated. Under these circumstances, there is no need for the input gates 11 or the input register 12. The blocks 16, 17 and 18 operate on the data directly available from the keyboard to perform these respective functions as before - except there no longer is a need to gate the keyboard data into the system as with input gate 11. Otherwise, the system operates as before.

A particular embodiment of the invention has been described in connection with a keyboard selection control circuit. Generically, the invention deals with the problem of contact bounce and the actuation of succeeding circuits from a plurality of control switches. It will be appreciated by those skilled in the art that the particular utilization of the invention in environments other than those affiliated with keyboards may be developed. All such modifications as come within the spirit and scope of the appended claims are intended to be embraced within the confines of the present invention.

What is claimed and desired to be secured by Letters Patent of the United States is:

1. A method for controlling the operation of circuitry in response to an analysis of the operation of individual ones of a plurality of switching means wherein said switching means produces at its output a respective signal in response to operation of individual ones of said switching means comprising the steps of storing a first produced signal in a second storage unit, storing a second produced signal in a first storage unit, replacing the contents of said second storage unit with the contents of said first storage unit, said replacing step comprising sensing the contents of said first storage unit to provide a first indication only in response to the contents of said first storage unit being sensed as representing the operation of only a single switching means, sensing the contents of said first and second storage unit and comparing the sensed contents of said first and second storage units to provide a second indication only in response to the contents of said first storage unit being different from that of the second storage unit, replacing the contents of said second storage unit with the contents of said first storage unit in response to said first and second indications, and controlling the operation of said circuitry in response to the contents of said second storage unit.

2. A method as defined in claim 1 further comprising sensing the completion of said operation of said circuitry in response to the contents of said second storage unit and enabling said replacing only in response to said sensed completion.

3. A method as defined in claim 1 wherein said first mentioned sensing comprises sensing the contents of said first storage unit to provide an indication of an invalid signal produced in response to coincident closure of more than one switching means and blocking storage in said second storage unit of said invalid signal in response to said last named indication.

4. A method of controlling circuitry as defined in claim 3 wherein said first mentioned sensing also includes sensing the contents of said first storage unit to provide an indication of an invalid signal produced in response to the non-operated condition of all said switching means and blocking storage in said second storage unit of said last mentioned invalid signal in response to said last named indication.

5. A method of controlling circuitry as defined in claim 1, including initiating a predetermined time delay in response to the sensed contents of said first storage unit providing an indication of the non-operated condition of all said switching means, and setting said second storage unit to a discrete condition upon elapse of said predetermined time delay.

6. A method of controlling circuitry as defined in claim 5, including overriding said time delay in response to signals being stored in said first storage unit before elapse of said time delay.

7. Apparatus for controlling circuitry in response to operation of individual ones of a plurality of switching means, comprising means for producing a respective signal in response to operation of each of said switching means wherein each signal represents the operation of a particular switching means, first storage means for storing said signals, second storage means for storing said signals after being stored in said first storage means, means for sensing signals stored in said first and second storage means, means for replacing signals stored in said second storage means with signals stored in said first storage means in response to signals sensed in said first storage means representing operation of only any one of said switching means and said signals sensed in said first storage means not being identical to the signals sensed in said second storage means, and means for operating said circuitry in response to signals stored in said second storage means.

8. Apparatus for controlling circuitry as defined in claim 7 further comprising means for producing time delayed signals in response to signals sensed in said first storage means representing a non-operated condition of all of said switching means, and means for clearing signals stored in said second storage means in response to said time delayed signals.

9. Apparatus for controlling circuitry as defined in claim 8 comprising means responsive to signals sensed in said first storage means for disabling said means for producing time delayed signals.

10. Apparatus for controlling circuitry as defined in claim 7 wherein said means for sensing comprises means for providing a first control signal in response to sensed concurrent signals in said first and second storage means representing stored signals which are identical, means for providing a second control signal in response to a sensed signal in said first storage means representing a non-operated switching means, means for providing a third control signal in response to a sensed signal in said first storage means representing more than one concurrent operated switching means, and means for blocking said replacing of signals in response to any one of said first, second or third control signals.

11. A method of controlling the operation of circuitry in response to an analysis of respective signals representing operation of individual ones of a plurality of switching means comprising, storing a first one of said signals in a storage device, sensing said stored first signal, sensing a second one of said signals, replacing said second signal with said first signal in said storage device in response to said sensed second signal representing operation of only any one of said switching means and said sensed stored first signal being different than said sensed second signal and controlling the operation of said circuitry in response to said stored signal.

12. A method according to claim 11 comprising sensing said controlling step, and blocking said replacing step until said last named sensing indicates that control of said circuitry has been effected in response to the signal stored in said storage unit.

13. A method of controlling circuitry according to claim 11 wherein operation of each switching means generates a discrete binary coded character, said sensing a second one of said signals comprises sensing an invalid signal generated by coincident closure of more than one switching means, and blocking said replacing step in response to said sensed invalid signal.

14. A method of controlling circuitry as defined in claim 13 wherein said sensing a second one of said signals further comprises sensing the non-operated condition of all of said switching means, and blocking said replacing step in response to said sensed non-operated condition.

15. A method of controlling circuitry according to claim 11 wherein said sensing of a second one of said signals comprises sensing the non-operated condition of all said switching means, initiating a predetermined time delay in response to said sensed non-operated condition, and setting said storage unit to a discrete condition upon an elapse of said predetermined time delay.

16. A method of controlling circuitry as defined in claim 15 including overriding said time delay in response to the operation of a switching means.

17. Apparatus for controlling the operation of circuitry in response to operation of individual ones of a plurality of switching means comprising means for producing at its output a respective signal in responses to successive operation of individual ones of said switching means wherein each signal represents the operation of a particular switching means, a signal storage means, means for applying a first one of said produced signals to said storage means for storage, means for sensing said stored first produced signals, means for sensing a second one of said produced signals, means for replacing said second signal with said first signal in said storage means in response to said sensed second signal representing operation of only any one of said switching means and not being identical to said sensed first signal, and means for controlling the operation of said circuitry response to the signals stored in such storage means.

18. Apparatus for controlling circuitry as defined in claim 17 wherein said means for replacing comprises means for comparing said sensed second signal with said sensed stored second signal to generate a first control signal when said sensed signals are identical, means responsive to a sensed second signal representing the condition when none of the switching means are operated to generate a second control signal, means responsive to a sensed second signal representing the condition when more than one of said switching means are operated to generate a third control signal, and logic means for blocking said means for replacing in response to any one of said first, second and third control signals.

19. Apparatus as defined in claim 17 further comprising means for sensing said output for produced signals before application to said storage means to detect the non-operated condition of all of said switching means, time delay means, means responsive to said sensed non-operated condition for enabling said time delay means, said time delay means setting said storage means to a discrete condition upon the elapse of a predetermined time delay.

20. Apparatus for controlling circuitry according to claim 19 further comprising means for disabling said time delay means in response to a sensed operated condition of said switching means.

21. Apparatus for controlling circuitry in accordance with claim 17 wherein said switching means comprises a plurality of keys on a keyboard and said means for producing a respective signal comprises means for generating a respective signal in response to operation of each of said keys.

22. In combination, a set of keyboard keys, means for operating each of said keys to produce a respective valid data signal representative of the operation of each of such keys, a signal storage device, means for gating each produced signal from said set of keys to said storage device for storage therein, a utilization circuit, means for applying each produced signal stored in said storage device to said utilization circuit, means responsive to concurrent operation of multiple keys or to nonoperation of any keys to provide a first and second control signal respectively, means for comparing a second produced signal prior to being gated with a first produced signal stored in said storage device to provide a third control signal only when said last named compared signals are identical, means responsive to said first, second or third control signals for blocking the gating of signals from said set of keys to said storage device by said gating means, means responsive to said second control signal for providing a fourth control signal after a predetermined time delay, means for clearing any signal stored in said storage means in response to said fourth control signal, and means responsive to a data signal being produced before said time delay has transpired for terminating the production of said fourth control signal.

23. An arrangement according to claim 22 further comprising means responsive to the absence of a first, second or third control signal and that second produced signals stored in said storage device have been applied to said utilization means for enabling said gating means to gate a third produced signal from said set of keys to said storage device.

24. An arrangement according to claim 22 wherein said time delay is greater than the period for key bounce and shorter than the normal human response time for operating the same key twice in succession.

25. An arrangement according to claim 24 wherein said time delay is in the order of 30 milliseconds.

26. In combination, a set of keyboard keys, means for operating each of said keys to produce a respective valid digital data signal representative of the proper operation of each of such keys and an invalid digital data signal representing concurrent multiple key operation or no-key operation, a signal storage register, means for gating each produced signal from said set of keys to said storage register for storage therein, a utilization circuit, means for applying each produced signal stored in said storage register to said utilization circuit, means responsive to a produced signal representing concurrent operation of multiple keys or to non-operation of any keys to provide a first and second control signal respectively, means for comparing a second produced signal prior to being gated with a first produced signal stored in said storage register to provide a third control signal only when said last named compared signals are identical, means responsive to said first, second or third control signals for blocking the gating of signals from said set of keys to said storage register by said gating means, means responsive to said second control signal for providing a fourth control signal after a predetermined time delay, means for clearing any signal stored in said storage register in response to said fourth control signal, and means responsive to a data signal being produced before said time delay has transpired for terminating the production of said fourth control signal.

27. An arrangement according to claim 26 further comprising means responsive to the absence of a first, second or third control signal and that second produced signals stored in said storage register have been applied to said utilization means for enabling said gating means to gate a third produced signal from said set of keys to said storage device.

\* \* \* \* \*

UNITED STATES PATENT OFFICE
CERTIFICATE OF CORRECTION

Patent No. 3,932,838　　　　　　　　　Dated January 13, 1976

Inventor(s) David N. Sitter　　　　　　　Page 1 of 2

It is certified that error appears in the above-identified patent and that said Letters Patent are hereby corrected as shown below:

Col. 3, line 40, after "several" insert -- operating --

Col. 6, line 8, cancel "inhibit" and insert -- $\overline{\text{inhibit}}$ --

Col. 6, line 18 cancel "on" and insert -- in --

Col. 7, line 51, cancel "1T" (second occurrence) and insert -- $\overline{1T}$ -- line 51, cancel "1R" (second occurrence) and insert -- $\overline{1R}$ --

Col. 7, line 61, cancel "1T" and insert -- $\overline{1T}$ -- line 61, cancel "1R" and insert -- $\overline{1R}$ --

UNITED STATES PATENT OFFICE
CERTIFICATE OF CORRECTION

Patent No. 3,932,838      Dated January 13, 1976

Inventor(s)    David N. Sitter      Page 2 of 2

It is certified that error appears in the above-identified patent and that said Letters Patent are hereby corrected as shown below:

Col. 8, line 4, cancel "1T" and insert -- $\overline{1T}$ -- line 5, cancel "1R" and insert -- $\overline{1R}$ -- line 14, cancel "1T" and insert -- $\overline{1T}$ -- line 15, cancel "1" (second occurrence) and insert -- $\overline{1}$ -- line 16, cancel "1" and insert -- $\overline{1}$ -- line 17, cancel "1T" and insert -- $\overline{1T}$ --

*Signed and Sealed this*

Thirty-first *Day of* May 1977

[SEAL]

Attest:

RUTH C. MASON  
*Attesting Officer*

C. MARSHALL DANN  
*Commissioner of Patents and Trademarks*